United States Patent
Chen

(10) Patent No.: US 7,554,814 B2
(45) Date of Patent: Jun. 30, 2009

(54) PORTABLE STORAGE DEVICE HAVING A SANDWICH PACKAGE STRUCTURE

(75) Inventor: Chih-Sheng Chen, Taipei County (TW)

(73) Assignee: Transcend Information, Inc., Taipei (TW)

( * ) Notice: Subject to any disclaimer, the term of this patent is extended or adjusted under 35 U.S.C. 154(b) by 234 days.

(21) Appl. No.: 11/674,161

(22) Filed: Feb. 13, 2007

(65) Prior Publication Data

US 2008/0192444 A1    Aug. 14, 2008

(51) Int. Cl.
 *H05K 1/14*    (2006.01)
(52) U.S. Cl. ........................ 361/740; 361/737
(58) Field of Classification Search ................ 361/715, 361/727, 740, 737; 439/345
See application file for complete search history.

(56) References Cited

U.S. PATENT DOCUMENTS

| | | | |
|---|---|---|---|
| 6,900,988 B2 * | 5/2005 | Yen | 361/737 |
| 7,095,617 B1 * | 8/2006 | Ni | 361/736 |
| 7,184,271 B2 * | 2/2007 | Watanabe | 361/727 |
| 7,447,037 B2 * | 11/2008 | Hiew et al. | 361/737 |
| 2003/0231472 A1 * | 12/2003 | Tseng et al. | 361/737 |
| 2006/0258196 A1 * | 11/2006 | Chen et al. | 439/141 |

FOREIGN PATENT DOCUMENTS

| CN | 2840603 Y | 11/2006 |
|---|---|---|
| TW | M269606 | 7/2005 |

* cited by examiner

*Primary Examiner*—Tuan T Dinh
*Assistant Examiner*—Yuriy Semenenko
(74) *Attorney, Agent, or Firm*—Winston Hsu

(57) ABSTRACT

A back cover, a middle frame, and a front cap are utilized as a sandwich package for packaging a portable storage device. An electronic element passes through the hollow middle frame and the middle frame holds the electronic element. The back cover covers the back end of the middle frame and the front cap covers the front end of the middle frame for fully packaging the electronic element. A moveable outer frame on the middle frame allows for withstanding the back cover and eliminating the manufacturing dimensional error of the PCB of the electronic element between the PCB and the back cover. The front cap covers the front end of the middle frame instead of the USB connector and provides the USB connector of the portable device more durability.

19 Claims, 11 Drawing Sheets

PORTABLE STORAGE DEVICE HAVING A SANDWICH PACKAGE STRUCTURE

BACKGROUND OF THE INVENTION

1. Field of the Invention

The present invention relates to a portable storage device, and more specifically, to a portable storage device having a sandwich package structure.

2. Description of the Prior Art

Most portable storage devices such as an MP3 player, a universal serial bus (USB) storage device, or a portable hard drive characterize with their small dimension for portability. A common USB storage device has its case made of plastic and assembled with snap fitting, screwing, or ultra sonic adhering. On the other hand, if the case of the USB storage device is made of metal or alloy, such as an aluminum extrusion case, the USB storage device is generally assembled by adhesive or screws, and the snap fitting way of assembly is not suitable for metal/alloy case since it is difficult to manufacture tiny size hooks with metal.

In the prior art, one type of package for portable storage devices includes a top cover and a bottom cover that jointly clip a print circuit board (PCB) as well as a flash memory and a USB connector so that the USB device is packaged inside the two-pieces case. Another type of package for portable storage devices includes a main housing where the PCB and the flash memory are fixed inside, the USB connector stretches out the main housing, and a cap covers the USB connector by directly wrapping the USB connector. However, both types of package for portable storage devices require one or more hooks or screws to assemble the case, which means the dimension of the products cannot be further reduced, or in other way of assembly, adhering the case together by adhesive or ultra sonic way, more manufacturing devices or materials are required.

Additionally, the prior art storage device usually has the cap directly wrapping and contacting the USB connector. Since the cap is a separable part each time the storage device is put to use, the repeated covering and removing of the cap from the USB connector may easily cause the USB connector to bend or wear in a short time.

SUMMARY OF THE INVENTION

The claimed invention provides a portable storage device having a sandwich package structure. The portable storage device comprises a circuit board, a front cap having a front opening, a back cover having a back opening, and a middle frame. The middle frame comprises an inner frame and an outer frame moveably ringing the inner frame. The inner frame has a front end and a back end. The front opening of the front cap detachably covers the front end of the inner frame, and the back opening of the back cover detachably covers the back end of the inner frame. The circuit board is assembled with the inner frame.

The claimed invention also provides a sandwich package. The sandwich package comprises a front cap having a front opening, a back cover having a back opening, and a middle frame. The middle frame comprises an inner frame and an outer frame moveably ringing the inner frame. The inner frame has a front end and a back end. The front opening of the front cap detachably covers the front end of the inner frame, and the back opening of the back cover detachably covers the back end of the inner frame.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
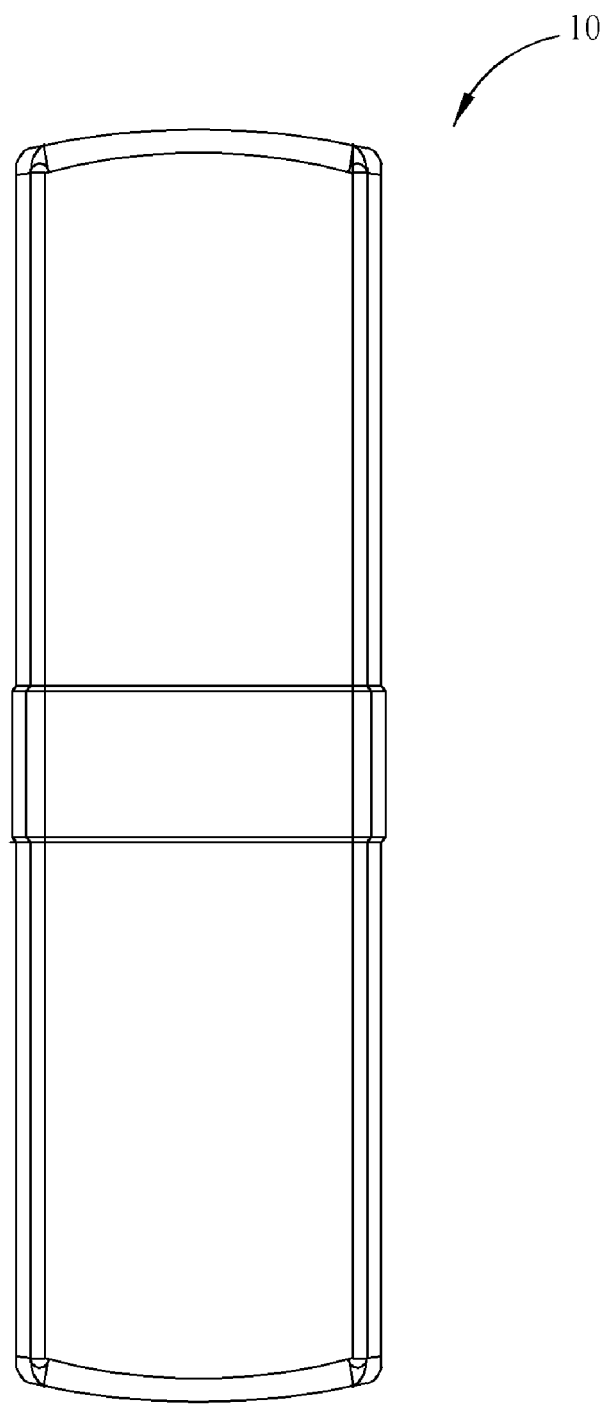
FIG. 1 is an illustration of a portable storage device having a sandwich package structure according to the present invention.
Figure 2:
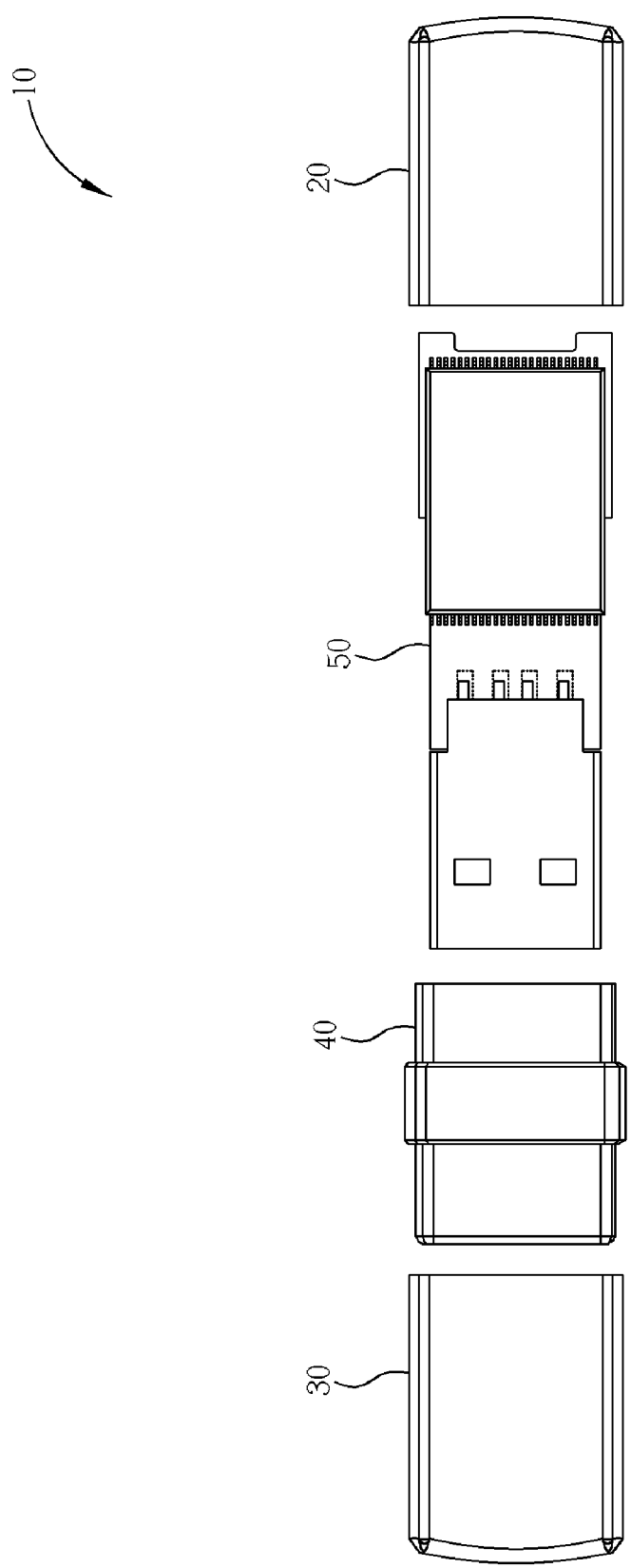
FIG. 2 is an illustration of the exploded view of the storage device in FIG. 1.

Please refer to FIG. 1 and FIG. 2. A portable storage device 10 having a sandwich package structure according to the present invention is illustrated in FIG. 1. FIG. 2 is the exploded view of the storage device 10. The storage device 10 comprises a back cover 20, a front cap 30, a middle frame 40, and an electronic element 50. Please also refer to FIG. 5. The electronic element 50 is used for various kinds of application such as a MP3 player, an universal serial bus (USB) storage device, or a portable hard drive. The electronic element 50 comprises a print circuit board (PCB) 55, a chip 53 (such as a flash memory) disposed on the PCB 55, and a connector 54 coupled with the chip 53. In the exemplary embodiment according to the present invention, the connector 54 is a USB connector for connecting to and communicating with a USB port in a computer system and therefore, the portable storage device 10 in the present invention is a USB portable storage device. However, the application of the present invention should not be restricted to the USB device mentioned in the exemplary embodiment.

Figure 3:
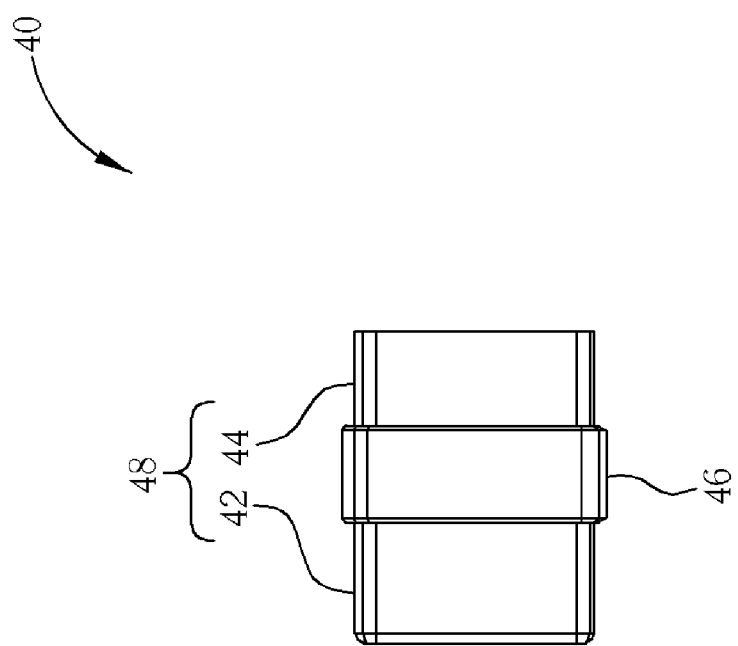
FIG. 3 and FIG. 4 are illustrations of the middle frame.
Figure 4:
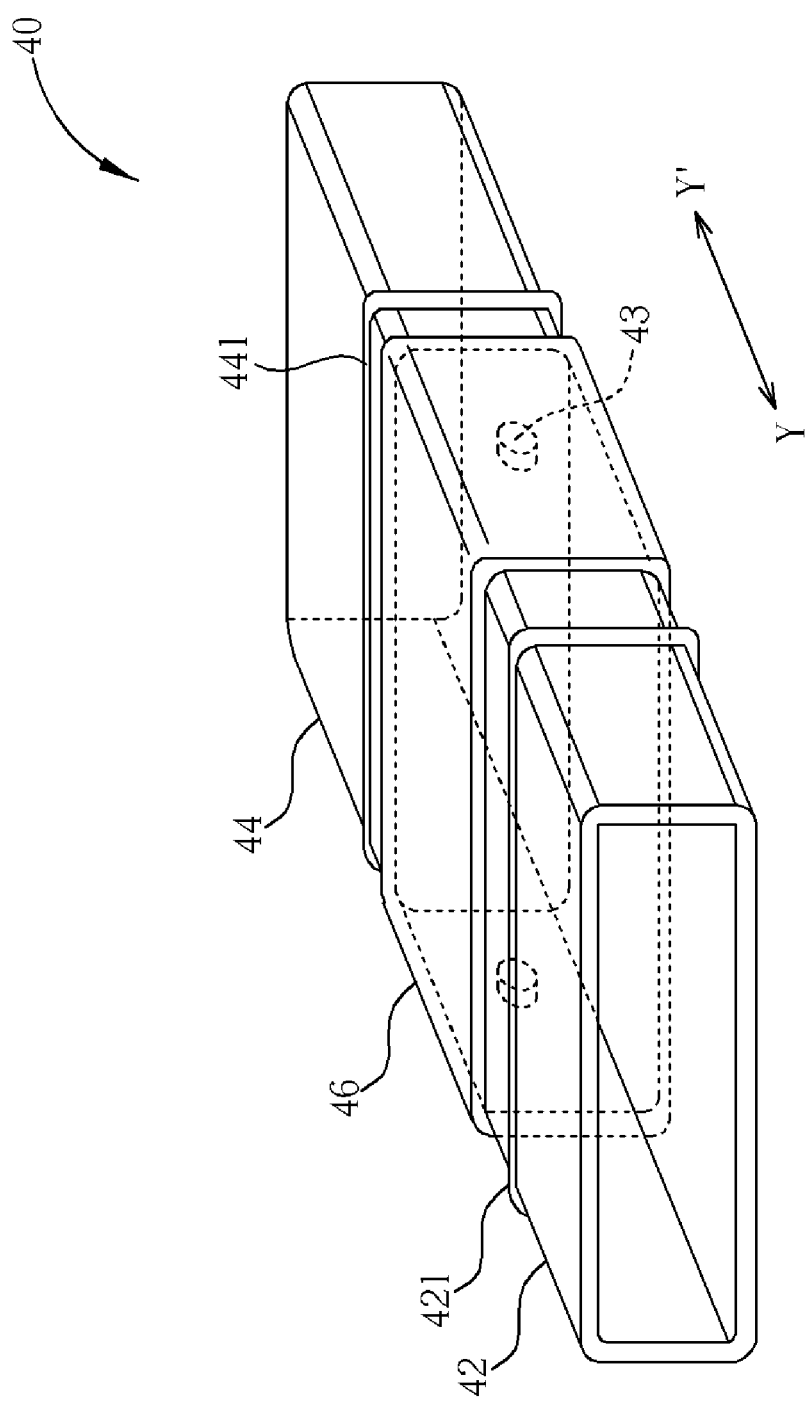

Please refer to FIGS. 2, 3, and 4. The middle frame 40 in the storage device 10 comprises an inner frame 48 and an outer frame 46. Both the inner frame 48 and the outer frame 46 are rectangular hollow frames and the outer frame 46 is installed on the inner frame 48 by laterally moveably ringing the inner frame 48, in which "laterally" is referred to as viewed in FIG. 2 and FIG. 3 and in the direction Y-Y' in FIG. 4. The inner frame 48 has two parts: a front end 42 and a back end 44. The middle frame 40 also comprises a plurality of holes 43 disposed at the sides of the middle frame 40. The plurality of holes 43 is covered by the outer frame 46 when the storage device 10 is assembled and when the outer frame 46 is removed from the inner frame 48, the plurality of holes 43 allows a maintenance tool to stick in and easily remove the middle frame 40 from the back cover 20. The inner frame 48 further comprises a front male fixer 421 disposed on the front end 42 for engaging with a front female fixer 302 (referring to the front cap 30 in FIG. 11) so that when the front cap 30 engages with the front end 42, the front cap 30 does not fall off from the front end 42. The inner frame 48 further comprises a back male fixer 441 disposed on the back end 44 for engaging with a back female fixer 202 (referring to the back cover 20 in FIG. 7) so that when the back cover 20 engages with the back end 44, the back cover 20 does not fall off from the back end 44.

Figure 5:
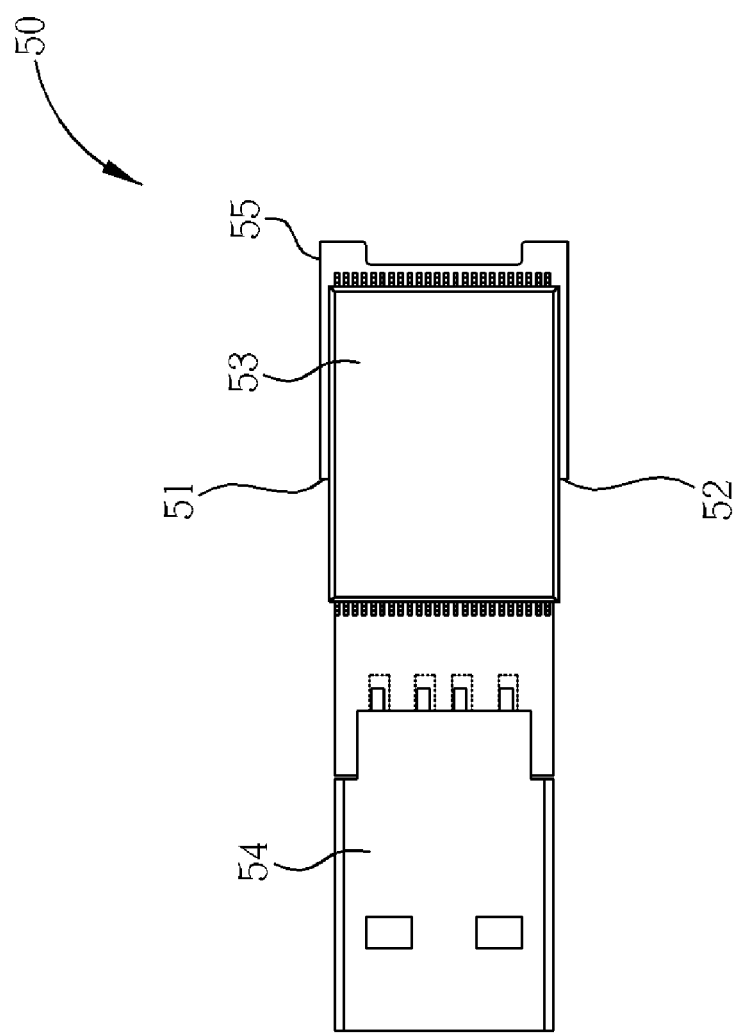
FIG. 5 is an illustration of the circuit board.
Figure 6:
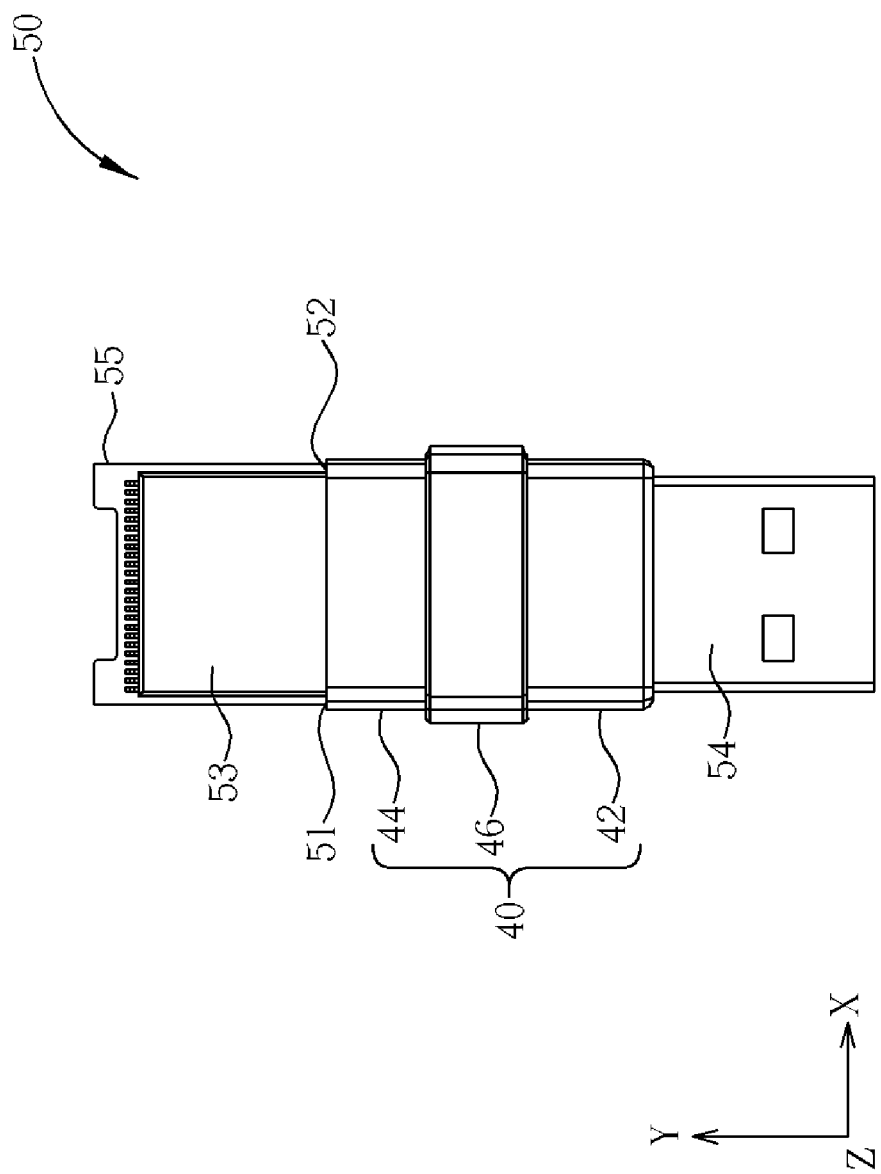
FIG. 6 is an illustration of the circuit board engaged with the middle frame.

In FIG. 5, the PCB 55 of the electronic element 50 has two edges 51, 52. When the electronic element 50 engages with the middle frame 40, the electronic element 50 passes through the hollow inner frame 48 until the edges 51, 52 withstand the back end 44 of the inner frame 48, as shown in FIG. 6. Once the electronic element 50 engages with the middle frame 40 as in FIG. 6, the USB connector 54 is stretching out of the middle frame 40 and the electronic element 50 is restricted to move in the direction X and Z by the middle frame 40.

Figure 7:
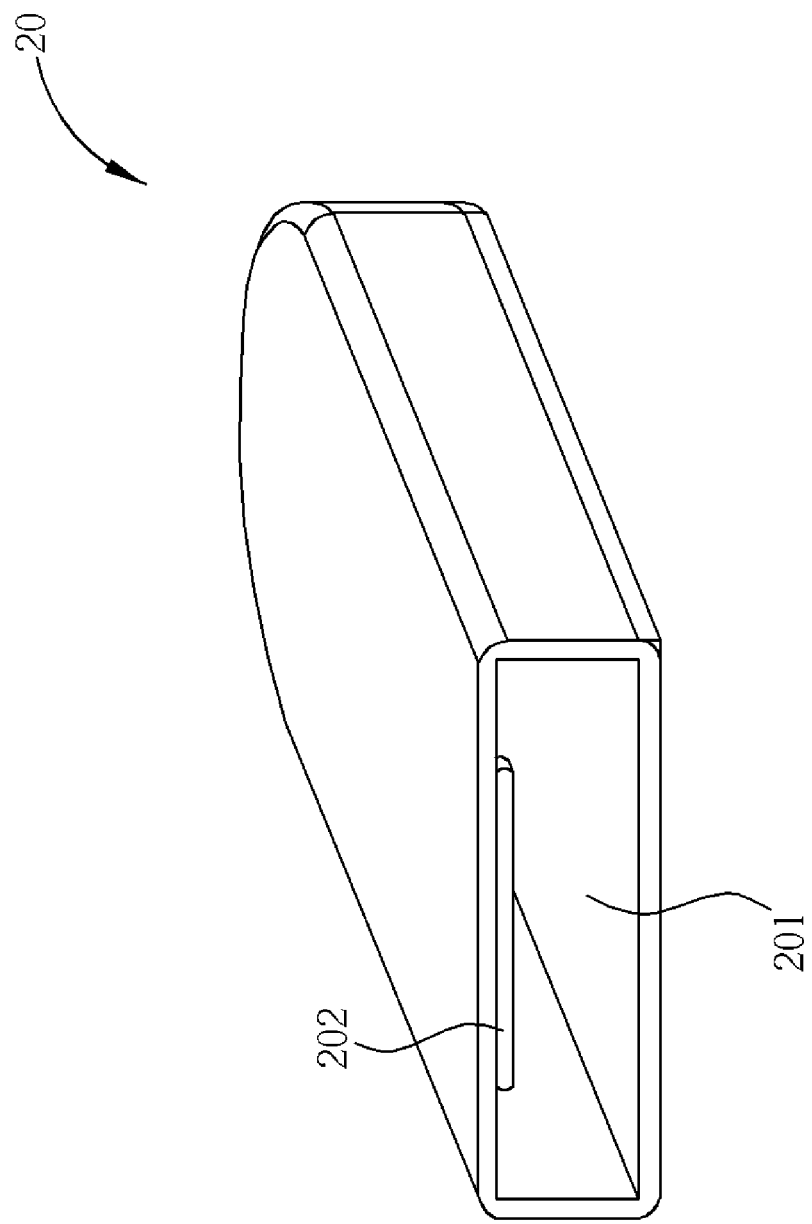
FIG. 7 is an illustration of the back cover.
Figure 8:
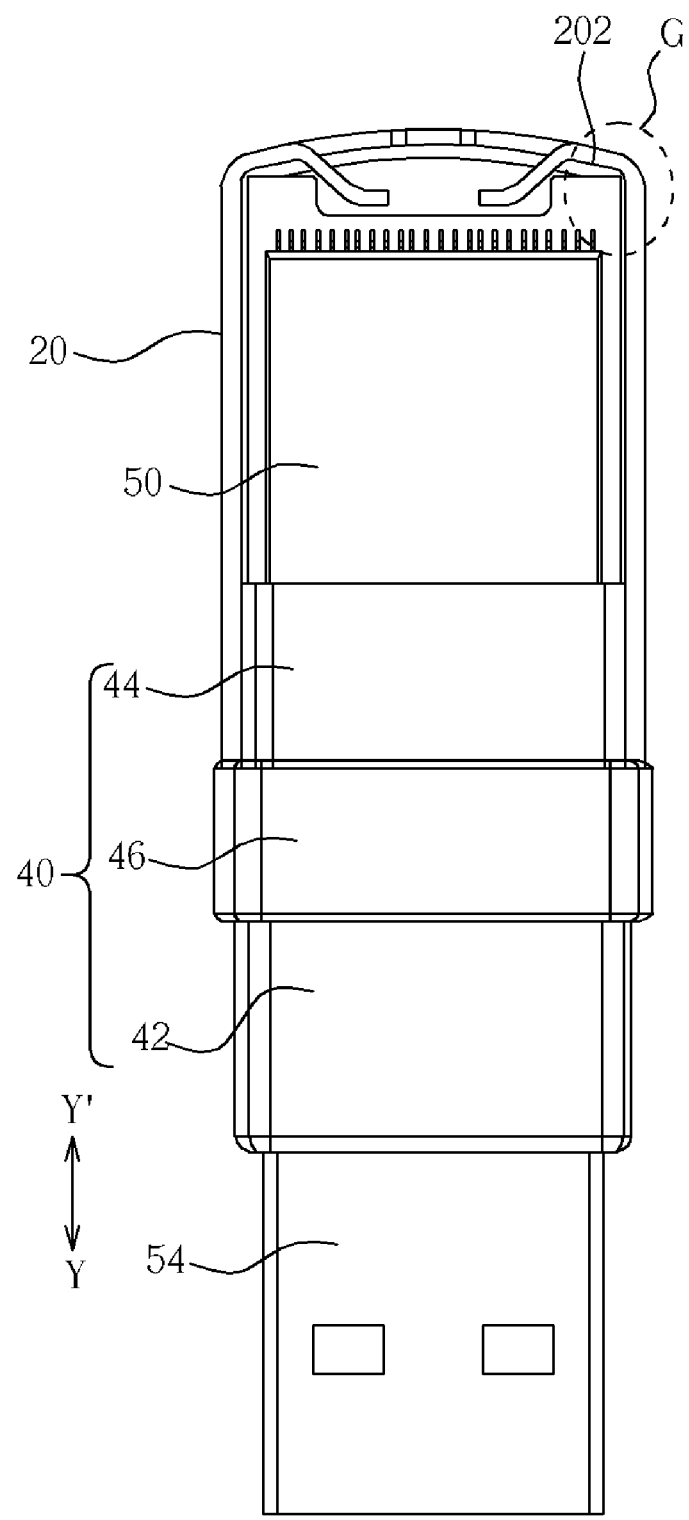
FIG. 8 is an illustration of the back cover engaged with the middle frame.
Figure 9:
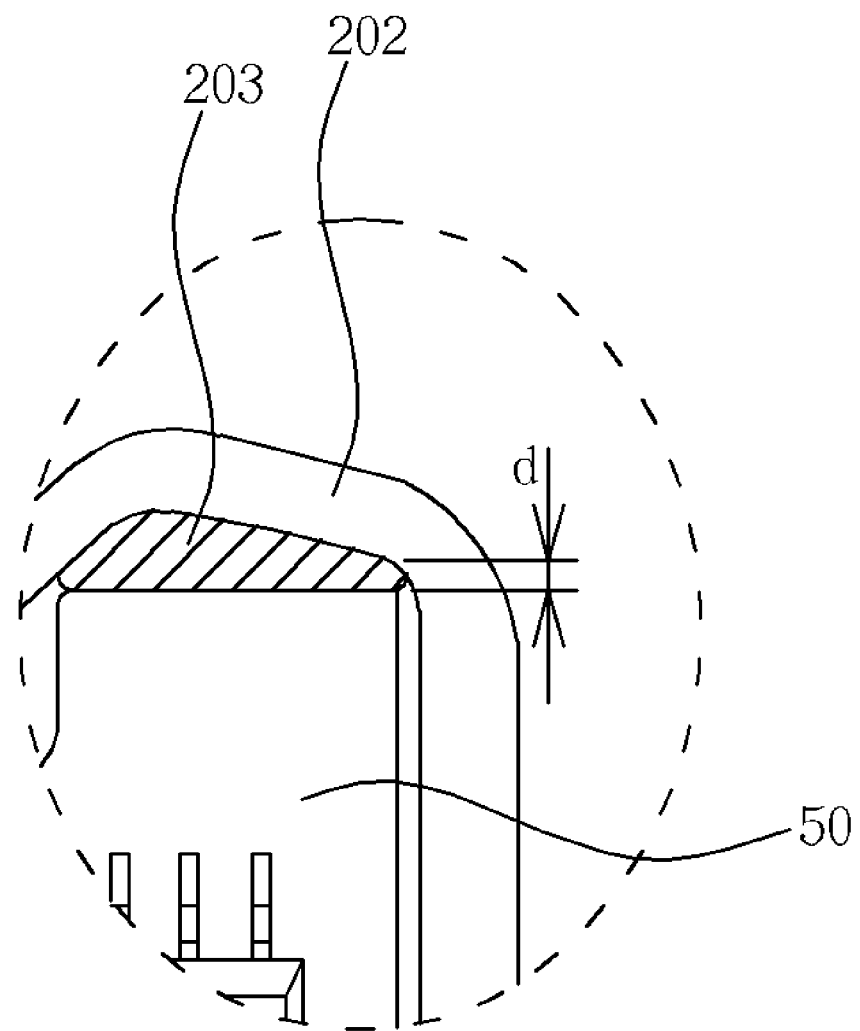
FIG. 9 is an illustration of an enlarged area of the circuit board and the back cover.

FIG. 7 is an illustration of the back cover 20. The back cover 20 is a monolithically formed cap having a back opening 201. FIG. 8 is an illustration of the back cover 20 engaging with the middle frame 40. The back cover 20 engages with the middle frame 40 by the back opening 201 detachably covering the back end 44 of the inner frame 48 and withstanding the outer frame 46 of the middle frame 40. While the back cover 20 engages with the middle frame 40, a gap d exists between the inner bottom 202 of the back cover 20 and the PCB 55 (refer to FIG. 5/6). Please refer to FIG. 9, which is an enlarged illustration of the area G in FIG. 8. The present invention provides two methods for eliminating the gap d, which is caused by the manufacturing dimensional error of the PCB 55 (refer to FIG. 5/6). In the exemplary embodiment in FIG. 9, a cushion 203 is disposed at the inner bottom 202 of the back cover 20 and when the back cover 20 engages with the middle frame 40, the outer frame 46 of the middle frame 40 is adjusted to a position along the direction Y-Y' so that the PCB 55 can be held by the cushion 203 while the back opening 201 of the back cover 20 withstands the outer frame 46. Another exemplary embodiment of the present invention provides the holding support for the PCB 55 directly by the inner bottom 202 of the back cover 20 by adjusting the outer frame 46 to a position along the direction Y-Y' until the inner bottom 202 withstands the PCB 55 while the back opening 201 withstands the outer frame 46. The position adjustable feature of the outer frame 46 allows the present invention the movement restriction of the electronic element 50 in the direction Y-Y' after the back cover 20 engages with the middle frame 40. Therefore, the electronic element 50 is "held" by the middle frame 40 and fixed by the middle frame 40 and the back cover 20.

Figure 10:
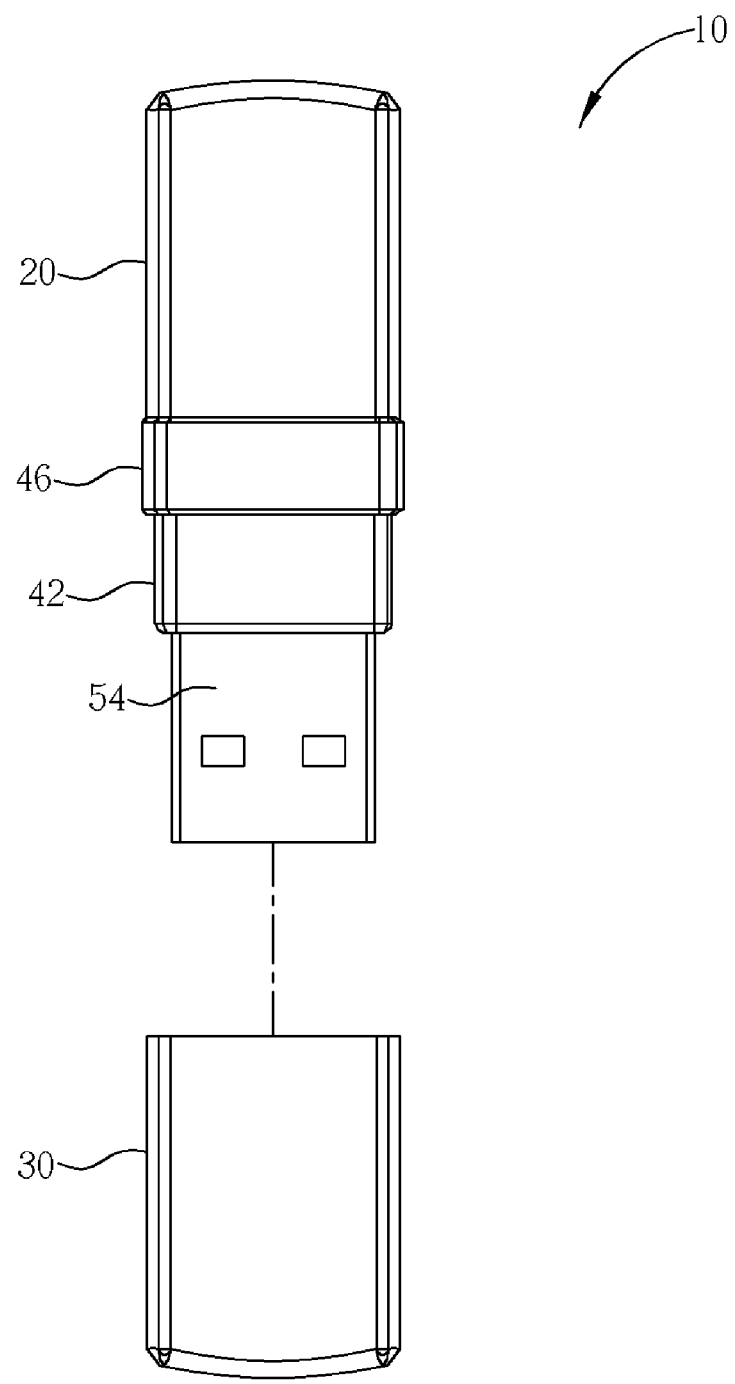
FIG. 10 is an illustration of the front cap engaging into the middle frame.
Figure 11:
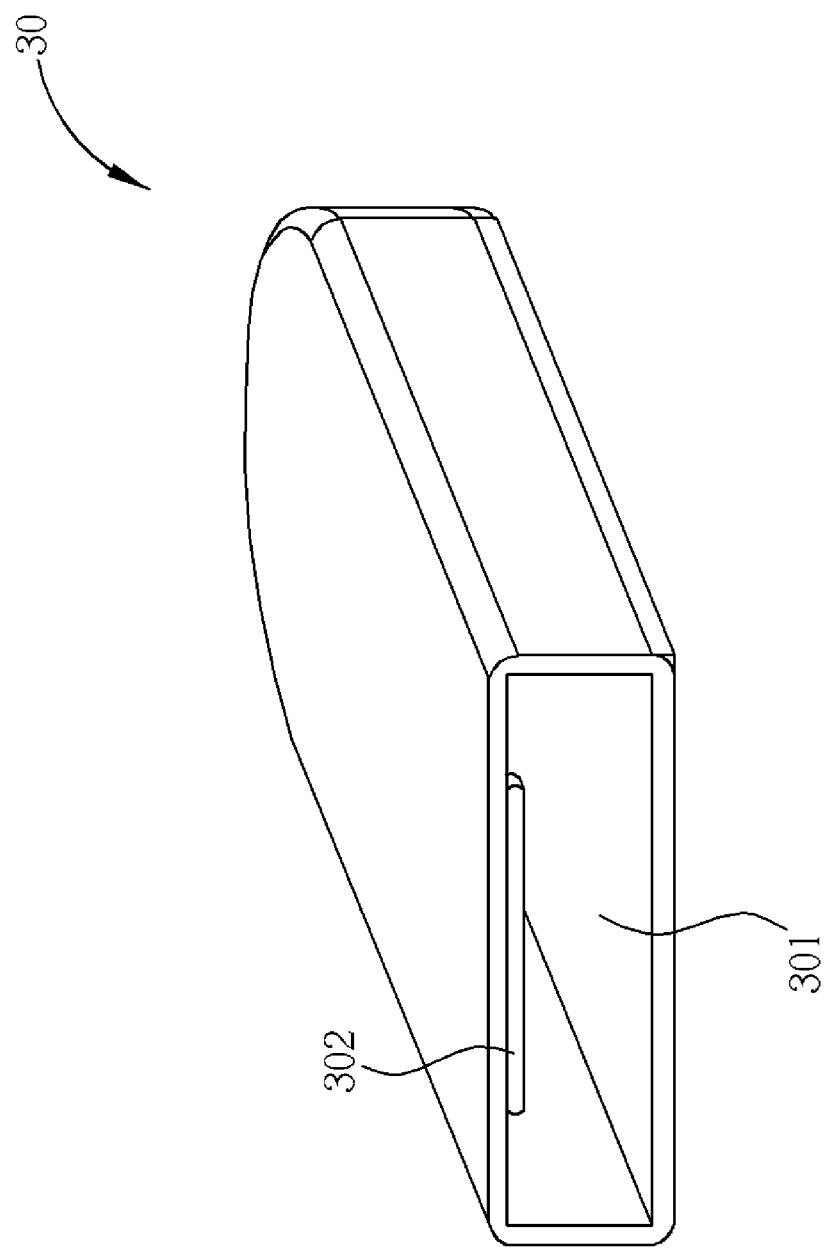
FIG. 11 is an illustration of the front cap.

Once the back cover 20 engages with the middle frame 40 (not shown), the electronic element 50 (not shown) except for the USB connector 54 is packaged by the middle frame 40 and the back cover 20, as shown in FIG. 10. The back cover 20, the middle frame 40, and the front cap 30 form the sandwich package mentioned in the present invention. The exposed USB connector 54 can be used to plug into a USB port of a computer system without the front cap 30 covering on. In the present invention, the front cap 30, also illustrated in FIG. 11, is substantially of a same dimension as the back cover 20 and therefore, the present invention takes only one manufacturing procedure to manufacture both the front cap 30 and the back cover 20. The front cap 30 is a monolithically formed cap having a front opening 301. When the front cap 30 covers the USB connector 54 for providing the USB connector 54 dustproof and violence-proof protection, the front opening 301 of the front cap 30 detachably covers the front end 42 of the inner frame 48 instead of the USB connector 54. In such way, the sandwich package of the present invention provides the USB connector 54 contact-free protection by the front cap 30. Additionally, as the USB storage device 10 as shown in FIG. 8, the outer dimension of the back end 44 of the inner frame 48 is slightly larger than that of the front end 42 in the present invention for tight fitting with the back cover 20. In another exemplary embodiment according to the present invention, since each member of the storage device 10 is monolithically made of stainless steel, the strength of the stainless steel allows the back end 44 of the middle frame 40 to have a small protrusion thereon and when the back cover 20 covers the back end 44 of the middle frame 40, the back cover 20 contacts the small protrusion and has tight fit with the back end 44. When the back cover 20 engages with the back end 44, the back cover 20 is in tight fit with the back end 44 so that the back cover 20 is fixed on the middle frame 40 while the front cap 30 can be easily covered or removed by a user since the outer dimension of the front end 42 is slightly smaller than that of the back end 44 and is in loose fit with the front cap 30.

In the storage device 10 and the sandwich package in the exemplary embodiment of the present invention, the back cover 20, the front cap 30, and the middle frame 40 (the inner frame 48 and the outer frame 46 separately) are monolithically formed with stainless steel or alloy with high robustness respectively. Therefore, the sandwich package of the present invention provides a small dimension and rigid protection for a USB portable storage device. The monolithically manufacturing of the members in the present invention further omits the need for tiny size hooks/screws, which brings about the manufacturing challenge and difficulty. Besides, the monolithically manufacturing of the members in the present invention also provides ESD and EMI-proof benefits.

The present invention utilizes a back cover, a middle frame, and a front cap as a sandwich package for packaging a portable storage device. An electronic element passes through the hollow middle frame and the middle frame holds the electronic element. The back cover covers the back end of the middle end and the front cap covers the front end of the middle end for fully packaging the electronic element. A moveable outer frame on the middle frame allows for withstanding the back cover and eliminating the manufacturing dimensional error of the PCB of the electronic element between the PCB and the back cover. The front cap covers the front end of the middle frame instead of the USB connector and provides the USB connector of the portable storage device more durability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A portable storage device having a sandwich package structure, comprising:
    a circuit board;
    a front cap having a front opening;
    a back cover having a back opening; and
    a middle frame, comprising:
        an inner frame having a front end and a back end, the front opening of the front cap detachably covering the front end of the inner frame, the back opening of the back cover detachably covering the back end of the inner frame, the circuit board being assembled with the inner frame; and
        an outer frame ringing the inner frame and moveable along a first direction relative to the inner frame;
        wherein the inner frame and the outer frame of the middle frame are separately monolithically formed structures.

2. The portable storage device of claim 1, wherein the inner frame further comprises a plurality of holes.

3. The portable storage device of claim 1, wherein the circuit board further comprises an edge withstanding the back end of the middle frame.

4. The portable storage device of claim 1, wherein the front cap and the back cover are substantially of the same dimension.

5. The portable storage device of claim 1, wherein the back opening of the back cover detachably covers the back end of the middle frame with the back opening withstanding the outer frame of the middle frame and the inner bottom of the back cover withstanding the circuit board.

6. The portable storage device of claim 1, wherein the back cover further comprising a cushion disposed at the inner bottom of the back cover for withstanding the circuit board.

7. The portable storage device of claim 1, wherein the dimension of the back end of the middle frame is larger than the dimension of the front end of the middle frame.

8. The portable storage device of claim 1, wherein the inner frame is hollow for the circuit board to assemble with the inner frame by passing through the inner frame.

9. The portable storage device of claim 1, wherein the inner frame further comprises a front male fixer disposed on the front end, the front cap further comprises a front female fixer for engaging with the front male fixer.

10. The portable storage device of claim 1, wherein the inner frame further comprises a back male fixer disposed on the back end, the back cover further comprises a back female fixer for engaging with the back male fixer.

11. A sandwich package, comprising:
a front cap having a front opening;
a back cover having a back opening; and
a middle frame, comprising:
an inner frame having a front end and a back end, the front opening of the front cap detachably covering the front end of the inner frame, the back opening of the back cover detachably covering the back end of the inner frame; and
an outer frame ringing the inner frame and moveable along a first direction relative to the inner frame;
wherein the inner frame and the outer frame of the middle frame are separately monolithically formed structures.

12. The sandwich package of claim 11, wherein the inner frame further comprises a plurality of holes.

13. The sandwich package of claim 11, wherein the front opening and the back opening are substantially of the same dimension.

14. The sandwich package of claim 11, wherein the back opening of the back cover detachably covers the back end of the middle frame with the back opening withstanding the outer frame of the middle frame.

15. The sandwich package of claim 11, wherein the back cover further comprising a cushion installed on the inner bottom of the back cover.

16. The sandwich package of claim 11, wherein the dimension of the back end of the middle frame is larger than the dimension of the front end of the middle frame.

17. The sandwich package of claim 11, wherein the inner frame is hollow.

18. The sandwich package of claim 11, wherein the inner frame further comprises a front male fixer disposed on the front end, the front cap further comprises a front female fixer for engaging with the front male fixer.

19. The sandwich package of claim 11, wherein the inner frame further comprises a back male fixer disposed on the back end, the back cover further comprises a back female fixer for engaging with the back male fixer.

* * * * *